United States Patent
Letertre et al.

(10) Patent No.: US 6,908,828 B2
(45) Date of Patent: *Jun. 21, 2005

(54) SUPPORT-INTEGRATED DONOR WAFERS FOR REPEATED THIN DONOR LAYER SEPARATION

(75) Inventors: Fabrice Letertre, Grenoble (FR); Thibaut Maurice, Grenoble (FR)

(73) Assignee: S.O.I. TEC Silicon on Insulator Technologies S.A., Bernin (FR)

( * ) Notice: Subject to any disclaimer, the term of this patent is extended or adjusted under 35 U.S.C. 154(b) by 0 days.

This patent is subject to a terminal disclaimer.

(21) Appl. No.: 10/887,881

(22) Filed: Jul. 12, 2004

(65) Prior Publication Data

US 2004/0241959 A1 Dec. 2, 2004

Related U.S. Application Data

(63) Continuation of application No. 10/327,790, filed on Dec. 23, 2002, now Pat. No. 6,815,309.

(30) Foreign Application Priority Data

Dec. 21, 2001 (FR) .............................................. 01 16713

(51) Int. Cl.[7] .............................................. H01L 21/76
(52) U.S. Cl. ...................... 438/406; 438/455; 438/409; 438/456; 438/457; 438/479; 438/435; 438/753; 438/954; 438/690; 438/459
(58) Field of Search ................................ 438/406, 455, 438/409, 456, 457, 458, 479, 735, 753, 954, 690, 459

(56) References Cited

U.S. PATENT DOCUMENTS

| | | | | |
|---|---|---|---|---|
| 4,839,310 A | * | 6/1989 | Hollis et al. ................. | 438/173 |
| 5,395,788 A | | 3/1995 | Abe et al. ...................... | 437/61 |
| 5,489,539 A | * | 2/1996 | Kubena ........................ | 438/172 |
| 5,514,235 A | | 5/1996 | Mitani et al. ................ | 156/153 |
| 5,539,245 A | | 7/1996 | Imura et al. ................. | 257/610 |
| 5,548,129 A | * | 8/1996 | Kubena ........................ | 257/24 |
| 6,010,579 A | | 1/2000 | Henley et al. .............. | 148/33.2 |
| 6,245,479 B1 | * | 6/2001 | Etzel ........................... | 430/200 |
| 6,326,279 B1 | | 12/2001 | Kakizaki et al. ............ | 438/406 |

FOREIGN PATENT DOCUMENTS

| | | |
|---|---|---|
| DE | 199 43 101 A1 | 4/2001 |
| JP | 62-179110 | 8/1987 |
| JP | 02-194519 | 8/1990 |

* cited by examiner

Primary Examiner—Paul E. Brock, II
Assistant Examiner—Victor V. Yevsikov
(74) Attorney, Agent, or Firm—Winston & Strawn LLP

(57) ABSTRACT

Processes that may be used in producing electronic, optoelectronic, or optical components may be provided. The processes may involve preparing a reusable donor wafer for donating a thin layer of semiconductor material by assembling a donor layer of a semiconductor material having a thickness of plural thin layers onto a support layer of. The semiconductor material for the support layer may be selected to be less precious or to have a lower quality than the donor layer. The support layer may have sufficient mechanical characteristics for supporting the donor layer during desired semiconductor processing treatments.

21 Claims, 1 Drawing Sheet

SUPPORT-INTEGRATED DONOR WAFERS FOR REPEATED THIN DONOR LAYER SEPARATION

CROSS REFERENCE TO RELATED APPLICATION

This application is a continuation of U.S. patent application Ser. No. 10/327,790 filed Dec. 23, 2002 now U.S. Pat. No. 6,815,309, the content of which is expressly incorporated herein by reference thereto.

FIELD OF THE INVENTION

The present invention relates in general to the fabrication of semiconductor substrates, and more particularly, to assembling a donor wafer.

BACKGROUND

Known techniques for preparing a wafer that includes a thin semiconductor layer for forming circuitry (e.g., electronic, optoelectronic, or optical circuits or components) include Smart-Cut® type processes. In general, such processes involve implantation of a gaseous species at a controlled depth in a bulk donor wafer in order to create a weakness at a desired depth in the donor wafer, and the application of stresses to cause a separation at the desired depth due to the weakness. Molecular adhesion or wafer bonding may have been used before separation to bond a receiving wafer with a layer of the bulk donor wafer to be separated. Molecular adhesion or wafer bonding may be typical techniques by which the separated layer from the donor wafer and the receiving wafer are assembled. Once separated, further processing for producing circuits or components for the circuits in the separated layer may take place.

In some circumstances (e.g., when re-use is desired), it may be desired to subject the remaining structure of the donor wafer to further processing. The remaining structure may be the subject of mechanical, chemical-mechanical, or other polishing steps to ready remaining portions of the donating material of the donor wafer for further use. Other processing activities may involve chemical cleaning steps, relatively high temperature operations (e.g., 300 to 900° C., such as for oxide deposition), or substantially high temperature operations (e.g., 1150° C., such as for thermal oxidation in cases such as a silicon carbide wafer).

In some circumstances, it may be desired to recycle the bulk donor wafer through reuse. In such circumstances, the remaining structure may be required to be subject to additional implantation of one or more gaseous species, bonding with a receiving wafer, or further separation steps (e.g., through thermal or mechanical stresses).

Such reuse may progressively decrease the thickness of the donor wafer through consecutive removal of thin layers from the donor wafer. Progressively decreasing the thickness of the donor wafer may lead to an excessively thin donor wafer, which may not be reusable for further recycling.

There are other difficulties or deficiencies that are faced in recycling a donor wafer. There may be a high risk of fracture during predominantly mechanical operations such as when stress is applied to separate a thin layer from the donor wafer or such as when bonding is performed through CMP planarization of a surface oxide, etc. A high risk of fracture also arises for example during high-temperature heat treatment. The risk may be due to non-uniform temperatures in a donor wafer.

There may also be a high risk of fracture when an operator or processing machinery is required to handle a donor wafer. Another deficiency may involve large strains that are induced in certain operating steps when a donor wafer has been thinned through reuse. Operations such as implanting gaseous species or certain deposition steps may induce strains in thinner donor wafers that may cause the wafers to sag significantly (e.g., causing a wafer to take on a convex profile). Sagging may seriously compromise operations that require suitably flat contacting surfaces. Thus, a donor wafer may not be usable for further recycling once a minimum donor wafer thickness has been reached (e.g., a thickness at which deficiencies or drawbacks mentioned above may exist).

Discontinuing recycling at a minimum donor wafer thickness may be economically detrimental and/or inefficient in material consumption because the remaining material is typically discarded as waste material. Deficiency in this process is heightened in cases where the semiconductor material of a donor wafer is relatively expensive (e.g., is a high quality semiconductor material) or relatively fragile. For example, in the case of a standard silicon carbide wafer (e.g., a silicon carbide wafer having a standard diameter of 2 inches), a wafer thinned to about 200 $\mu$m may become unusable either because of frequent fractures during the process or because of a sag caused by implantation of gases prevents the wafer from suitably bonding to a receiving wafer.

In other applications, thickness may be relatively thin from a starting donor wafer (e.g., because wafers for a particular semiconductor material are typically offered on the market at that thickness). Gallium Nitride donor wafer may be one such example. Known techniques for producing such wafers involve using a thick epitaxy technique called HPVE (Hybrid Vapor Phase Epitaxy) on an epitaxially grown substrate (seed layer) that is removed after epitaxy. This technique, however, has two major drawbacks. Firstly, it only makes it possible to obtain self-supporting wafers having a thickness of at most around 200 to 300 $\mu$m. If a greater thickness is sought, imperfect lattice matching with the seed layer may generate excessive strains. Secondly, the rate of growth using the thick epitaxy technique is extremely slow (typically, 10 to 100 $\mu$m per hour). Such drawbacks may seriously handicap manufacturing costs.

Drawbacks may also be associated with conventional techniques in which ingots of some single crystal semiconductor material such as SiC are used for producing bulk donor wafers. In conventional techniques in which ingots of semiconductor material such as SiC are used for producing bulk donor wafers, the following operating steps are typically implemented: the ingot may be cut (e.g., using a saw) into slices having a thickness of around 1 mm, each of the faces of the slice may be coarsely polished to remove crystal damaged by sawing and to obtain good planarity, and the future front face (the removal face) may be successively polished to obtain appropriate surface roughness. Such techniques, which may start from relatively thick slices, may often involve substantial losses of material during the successive polishing steps. This obviously affects the manufacturing cost.

Thus, there is a need for providing such processes and structures in a more economically advantageous and efficient way. Within this context, there may also be a need to continue recycling even when extremely small thickness is reached.

SUMMARY OF THE INVENTION

The invention relates to a process for repeated treatment of wafers, comprising preparing a reusable donor wafer for donating a thin layer of a semiconductor material by assembling a donor layer of semiconductor material having a thickness of plural thin layers onto a support layer of a semiconductor material, wherein the semiconductor material of the support layer is of a lower quality or is less precious than the semiconductor material of the thin layer or layers of the donor wafer. The semiconductor material of the support layer can be a monocrystalline, non-monocrystalline or polycrystalline material, while the semiconductor material of the thin layer or layers is preferably a monocrystalline material.

Advantageously, the semiconductor material of the support layer and of the thin layer or layers is less precious due to differences in price, availability, or usability. For example, the semiconductor material of the support layer can be monocrystalline silicon while the semiconductor material of the thin layer or layers can be monocrystalline silicon carbide. Alternatively, the semiconductor material of the support layer can be polycrystalline silicon carbide and the semiconductor material of the thin layer or layers can be gallium nitride.

The invention also relates to an electronic, optoelectronic, or optical component comprising a donor layer of semiconductor material having a thickness of plural thin layers onto a support layer of a semiconductor material, wherein the semiconductor material of the support layer is of a lower quality or is less precious than the semiconductor material of the thin layer or layers of the donor wafer. The advantageous and preferred materials for these layers is as discussed herein.

Yet another aspect of the invention relates to a process for repeated treatment of wafers to transfer plural thin layers therefrom, comprising preparing a reusable donor wafer for donating a thin layer of semiconductor material by assembling a donor layer of a monocrystalline semiconductor material having a thickness of plural thin layers onto a support layer of a non-monocrystalline semiconductor material, and sequentially transferring plural thin layers from the donor layer to receiving wafers by separation of each thin layer along a region of weakness in the donor layer prior to transfer of a thin layer to a receiving wafer.

Further features, objects and advantages of the present invention will become more clearly apparent on reading the following detailed description of preferred embodiments of implementation of the invention, the description being given by way of non-limiting example and with reference to the appended drawings.

DETAILED DESCRIPTION OF PREFERRED EMBODIMENTS

Figure 1A:
FIGS. 1a–1e are block diagrams of semiconductor materials in an illustrative sequence for preparing a reusable donor wafer and forming a thin layer from the donor wafer for forming electronic, optoelectronic, and optical circuitry in accordance with embodiments of the present invention.

In accordance with the principles of the present invention, a process for repeated treatment of wafers is provided that involves preparing a reusable donor wafer for donating a thin layer of semiconductor material by assembling a donor layer of semiconductor material (e.g., a monocrystalline semiconductor material) having a thickness of plural thin layers onto a support layer (e.g., a support layer of a non-monocrystalline semiconductor material). Thus, a support layer is provided in a donor wafer that is of a lower quality or less precious than the donor layer of the wafer. With respect to "less precious," for example, monocrystalline silicon is considered to be less precious than monocrystalline silicon carbide. Another example is that the monocrystalline material of one semiconductor is considered to be less precious than a higher quality monocrystalline material of the same semiconductor due to differences (e.g., substantial differences) in price, availability, or usability. The processes of the invention preferably are used for providing an electronic, optoelectronic, or optical component.

In one aspect, a process is provided for transferring successive thin layers from a semiconductor material of a donor wafer to a receiving wafer. A bulk slice may be assembled that includes a donor layer of a semiconductor material and a support layer. The donor layer and the support layer may form a mechanically stable assembly, which may constitute a donor wafer. A region of weakness may be created in the donor layer at a controlled depth. The donor wafer may be bonded to a receiving wafer via the free side of the donor layer of the donor wafer. A separation may be effected in the region of weakness of the donor layer to transfer a thin layer of the semiconductor material from the donor wafer to the receiving wafer. The process may be repeated to recycle the "assembled" donor wafer without breaching the support layer of the donor wafer.

If desired, assembly of the donor wafer may be carried out by wafer bonding using polished faces of the donor layer (which may be a bulk slice) and a support (which may be the support layer). High temperature welding between polished faces may also be used for preparing the assembly. If desired, a region of weakness may be created by implanting gaseous species. In some embodiments, wafer bonding may be implemented to bond the donor wafer to the receiving wafer. Separation of the thin layer may be effected by applying stresses, especially thermal and/or mechanical stresses.

With the use of a support layer, the donor wafer may be recycled a maximum number of times to separate thin layers from the donor layer. The maximum number of times may depend on the thickness of the donor layer and the depth at which a weakness is created in the donor wafer in each cycle.

If desired, the donor layer may be a single crystal semiconductor material and the support may be a single crystal of inferior quality, a single crystal material of a different semiconductor, the same semiconductor in polycrystalline form, or the same semiconductor as a different polytype. The semiconductor material of the donor layer, support layer, or both may for example be silicon, silicon carbide, or large-gap monometallic or polymetallic nitrides. In some embodiments, the donor layer may for example have a thickness of around 100 to 300 $\mu$m. In some embodiments, the support layer may for example have a thickness of around 100 to 300 $\mu$m.

The semiconductor material of the donor layer, support layer, or both may be a large-gap monometallic or polymetallic nitride such as gallium nitride.

If desired, the support layer may be a bulk layer and may be produced for example from silicon, gallium nitride, silicon carbide, aluminum nitride, or sapphire.

Another aspect is aimed at producing donor wafers with reduced losses, and therefore with more profitable use of the starting material (in this case single-crystal SiC). A process may be provided for producing a donor wafer intended to be used in a process for transferring successive thin layers of a given semiconductor material from the donor wafer to a receiving wafer. The process may involve producing a bulk slice of the semiconductor material and assembling the bulk slice and a support in order to form the donor wafer. These techniques may alleviate some of the drawbacks in conventional technology that exists when a slice from an ingot of a semiconductor material (e.g., SiC) is used as a bulk donor wafer.

If desired, the bulk slice may be produced by sawing an ingot or by thick-film epitaxy on a seed layer. If thick film epitaxy is used, the step of removing the seed layer may be implemented.

The bulk slice may be polished only on its face that is intended to come into contact with the support. In the prior art, both faces are typically coarsely polished. Polishing may be performed to a defined degree on the face of the bulk slice and the face of the support which are intended to come into contact with each other.

Assembling the bulk slice and the support may be carried out at a temperature and for a time such that wafer bonding or welding may be achieved between the bulk slice and the support. The semiconductor material of the bulk slice may be a single-crystal semiconductor and the support may be chosen from the group comprising the same semiconductor as the bulk slice but with a single crystal of inferior quality, the same semiconductor in polycrystalline form, or the same semiconductor as a different polytype. The bulk slice, the support, or both may be silicon, silicon carbide, or large-gap monometallic or polymetallic nitrides (e.g., gallium nitride). If desired, the support layer, the bulk slice, or both may be produced from silicon, gallium nitride, silicon carbide, aluminum nitride, or sapphire. If desired, other materials may be contemplated.

Techniques may be provided in which the cost and inefficiency in existing recycling techniques involved in Smart-Cut® type processes may be addressed. By bonding a support layer with a donor layer, an inexpensive handle wafer for the donor semiconductor material may be provided. Costs may be reduced by employing a support layer of a less-expensive semiconductor material since the primary purpose of the support layer will be to provide mechanical support for the donor layer during processing treatment that may involve, for example, implantation of gaseous species, bonding the donor side of a donor-support assembly to a receiving wafer, separating a thin layer from the donor-support assembly, polishing after separation, and/ or other further processing treatments. Lesser amounts of donor semiconductor materials may be scrapped using such techniques since a portion of the minimum thickness that is required for such processing may be fulfilled using the support layer. Bonding techniques may be implemented in such processes to use a donor layer and support layer that are made different types of semiconductor material.

In some embodiments, a starting donor wafer, that is used in a process for removing successive thin layers, may be formed by assembling a donor slice and a mechanical support. The assembling operation may be implemented using for example wafer bonding, performed on the donor slice and/or on the mechanical support and using appropriate interface bonding layers when appropriate.

A mechanical support may be chosen to have characteristics that are compatible, especially in terms of temperatures, with processing operations that will be applied to the donor wafer in successive cycles of removing thin layers from the donor slice. In this respect, one important factor may be the relationship between the thermal expansion coefficient of the material of the donor slice and that of the material of the mechanical support. Firstly, "homo-assemblies" may be distinguished, that is to say those with materials for the donor layer and for the support layer that have similar chemical and mechanical properties. Examples of such assemblies include:

single-crystal SiC (donor) on low-quality single-crystal or polycrystalline SiC (support);

single-crystal GaN (donor) on low-quality single-crystal or polycrystalline GaN (support); and single-crystal Si (donor) on low-quality single-crystal or polycrystalline Si (support).

When "homo-assemblies" are used, there is practically no limitation with respect to a thermal budget for producing the donor wafer. In such circumstances, the two materials are thermally well matched and the donor layer will typically be undisturbed by diffusion or the like.

"Hetero-assemblies", as opposed to "homo-assemblies" may be considered to be assemblies in which materials for the donor layer and for the support layer have different mechanical and/or chemical properties. Examples of "hetero-assemblies" may include single-crystal SiC (donner) on Si (support), indium phosphide InP on Si, and GaN on Si. Other "hetero-assemblies" may also be implemented.

In "hetero-assembly" type cases, the thermal budget or the temperature to which the assembly may be exposed may be more limited because there may exist a thermal mismatch between components of the assembly. A thermal mismatch may result in deformation or fracture. For example, in the case of a donor wafer made of SiC (donor layer) on Si (support layer), difficulties arise with temperatures of around 900 to 950° C. being exceeded.

Another factor to be considered is the thickness of the donor slice/support assembly produced, which may be selected to be compatible with the steps of the treatment that the wafer is to undergo and selected to allow as much of the donor layer to be consumed.

Once the bonding has been carried out and if necessary strengthened by suitable treatments, this assembly may be considered a full-fledged donor wafer, which may be handled during the successive process operations of removing thin layers as if it were a conventional bulk donor wafer that is homogeneous throughout its thickness. The number of thin layers removed may be chosen essentially according to the thickness of the donor layer and the depth of the region of weakness so that the final removal is effected without the support layer being reached and without any regions of defects likely to exist at the transition between the donor layer and the support layer, being reached.

If necessary, when the assembling operation has been completed, the donor wafer may be thinned at its rear face (on the support layer side) in order to adjust the thickness of the wafer and make it compatible with downstream technological steps and with possible standards. For example, when the support layer is made of silicon, this thinning step can be very easily carried out by mechanical lapping.

EXAMPLES

Example 1

SiC Case

When a donor slice consists of single-crystal SiC, it may be assembled on a support that comprises polycrystalline SiC. The assembling operation may be carried out by direct bonding or else by producing, on the faces to be assembled, intermediate layers made of silicon oxide $SiO_2$ for example.

Bonding may be performed by facilitating a bonding surface of the donor layer, support layer or both to suitably bond with the donor layer and support layer. For example, in cases where the donor is layer is monocrystalline and the support is polycrystalline, an amorphous layer may be formed on the support to facilitate the bonding of the two layers. Examples of such techniques are illustratively shown in Ser. No. 10/320,063 entitled "Method of Fabricating Substrates and Substrates Obtained by This Method" which was filed on Dec. 16, 2002, and which is incorporated herein in its entirety.

In terms of polarity, a SiC single crystal is, for example, bonded to a support on its Si face, whereas the C face of the single crystal is the exposed face from which thin layers will subsequently be removed. The reverse situation may also be possible. The question of polarity may occur with all materials having a hexagonal crystal structure such as GaN and AlN.

An initial polishing step on this face as well as intermediate polishing steps between two successive removal operations may preferably be carried out.

Because of the fact that the single-crystal SiC of the donor slice and the polycrystalline SiC of the mechanical support both have expansion coefficients close to $4.5 \times 10^{-6}$/K, the assembly thus formed may undergo, without any damage, all the recycling, chemical cleaning, deposition and heat treatment steps associated with the Smart-Cut process for transferring thin layers.

According to a variant, the mechanical support may be made of silicon. In this case, compatibility between the support and the donor slice from the thermal standpoint may prove to be inferior, but nevertheless remains satisfactory in particular if the maximum temperatures to which the assembly is subjected during the treatments are limited. For example it may be limited, by producing the oxide layers involved in bonding the thin layer using deposition and not thermal oxidation.

Advantageously, the fabrication of the donor slice/mechanical support assembly in this example may for example involve: cutting a slice from an ingot with a thickness substantially less than the usual thickness that is conventionally used for bulk single-crystal SiC donor wafers (e.g., a thickness of around 500 μm rather than around 1 mm); performing a polishing operation that is carried out on only one of the faces of the slice; positioning the polished face in intimate contact with a face of a suitably planar polycrystalline SiC support wafer to bond them together by wafer bonding; and producing the support wafer having a thickness for example of around 200 to 300 μm (before bonding with the donor layer) typically by thick-film deposition of the CVD type. It should be noted that a low-quality (and therefore inexpensive) single-crystal SiC, or a SiC of a polytype different from that of the donor layer (for example, 6H SiC for the support and 4H SiC for the donor layer), could also be used for the support.

Additional processing steps may include, exposing the assembly to a suitable thermal budget (for example 1100° C. for 2 hours) in order to obtain suitable bonding forces between the slice and the support wafer. The degree of polishing of the contacting faces should also be taken into account so that satisfactory wafer bonding may be obtained under the aforementioned conditions. A single thick single-crystal SiC (donor layer)/polycrystalline SiC (mechanical support layer) combination wafer may thus be obtained. As a variant, it may also be possible simply to lay the wafers on top of one another and bond them together by welding (typically at temperatures of 2000° C. or higher); however, this is more demanding.

The combination wafer is then polished on the free face of the single-crystal SiC, with the standard degree of polishing, in order to end up with a single-crystal SiC layer having no buried work-hardened region and having a suitable surface roughness.

This process may thus produce donor wafers with much less loss of expensive material (e.g., single-crystal SiC) than the technique mentioned in the introduction of using bulk slices. Moreover, the donor layer and the support may be assembled upstream in the wafer fabrication line, and therefore may not effect the process of transferring layers from the donor wafer to a receiver wafer.

The potential savings that may be achieved are even greater when the particular SiC ingot of interest is more difficult and/or more expensive to produce (e.g., a semi-insulating SiC ingot of very high purity obtained by HTCVD or of an SiC ingot having a very low concentration of intrinsic crystal defects such as dislocations and micropipes).

Example 2

GaN Case

In the case of the use of Smart-Cut® type techniques with a GaN donor wafer, various steps employed may involve temperatures that are generally very much lower than those encountered in the case of SiC. Thus, the problem of the respective thermal expansion coefficients of the support and the donor wafer is less crucial. This may give more flexibility in the choice of support material.

In the present example, a GaN slice of a thickness for example of around 100 to 200 μm may be wafer bonded to a mechanical support made of polycrystalline or single-crystal SiC for example. As in the case of SiC, the polarity of that face of the GaN wafer which will be on the support side and, consequently, the reverse polarity of that face of the wafer on the free side, that is to say on the side from which layers are removed, may be determined in advance.

The support layer/GaN donor layer assembly becomes a fully-fledged wafer used until the donor layer has been completely or almost completely consumed in the various cycles of a Smart-Cut® process.

Techniques described herein are illustratively shown in sequences shown in FIGS. 1a to 1e.

Slice 10 may be the semiconductor material that will form successively transferred thin layers. Wafer 20 may be a support wafer.

Figure 1B:
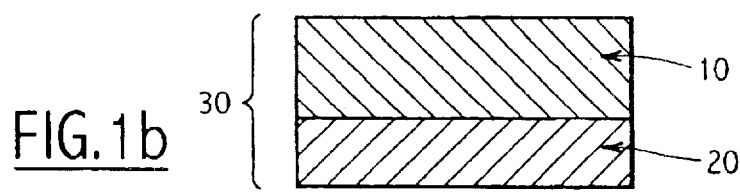
Figure 1C:
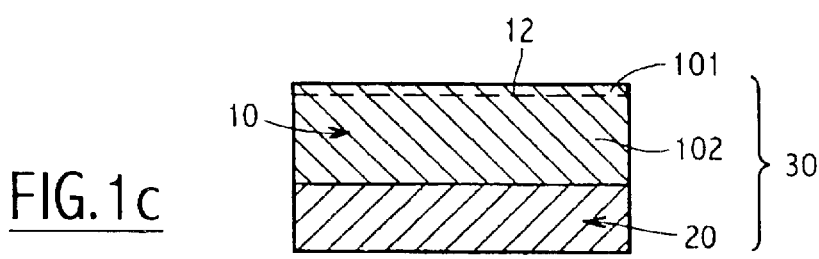
Figure 1D:
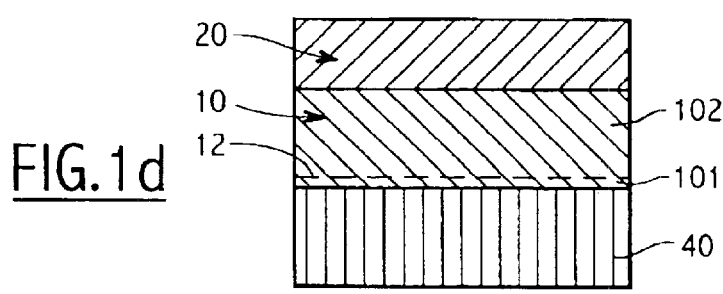

In FIG. 1b, slice 10 and support wafer 20 may be assembled using techniques illustratively described herein or using other techniques to form donor wafer 30. In FIG. 1c, buried region of weakness 12 may be formed at a certain depth from the free surface of donor layer 10. Region 12 may define thin layer 101 with respect to remainder 102 of the donor layer. In FIG. 1d, wafer bonding may be carried out between the free face of donor layer 10 (if necessary, with prior oxidation or other treatment on this face) and one face of receiving wafer 40 (if necessary, also with prior oxidation or other treatment on this face).

Figure 1E:
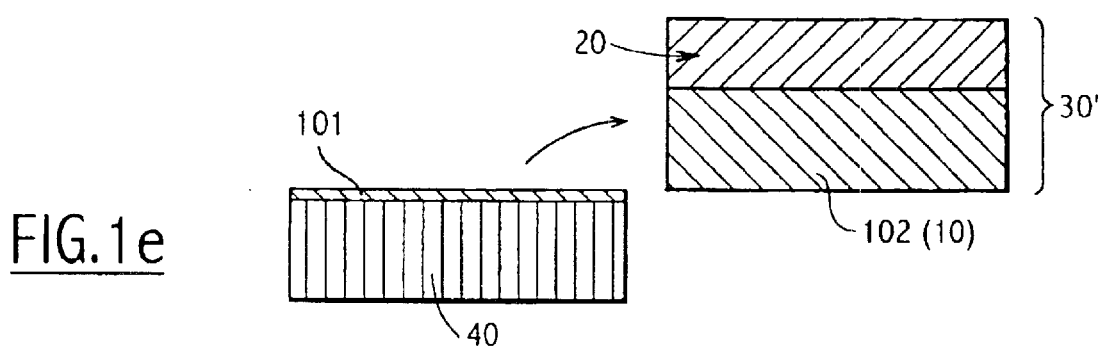

In FIG. 1e, a separation is performed, especially by thermal and/or mechanical stress, at the region of weakness 12 in order to obtain, on the one hand, desired assembly 40, 101, typically forming a substrate for applications in electronics, optoelectronics or optics, and, on the other hand, donor wafer 30' whose donor layer 10, essentially corresponding to region 102, has been substantially thinned down by the thickness of thin layer 101 that has been transferred.

These steps may be repeated with donor wafer 30' until donor layer 10 has been almost entirely consumed, without however breaching support layer 20.

In one implementation, steps shown in FIGS. 1*a* and 1*b* may be carried out on the premises of the donor wafer fabricator, whereas the following steps may be part of a separate process carried out on the premises of the fabricator of composite substrates for electronics, optoelectronics and optics industries.

Of course, the invention applies to the production of wafers comprising donor layers made of other materials, such as aluminum nitride and more generally semiconductor, especially large-gap, monometallic or polymetallic nitrides, diamond, etc., or else single-crystal silicon of very high quality for the donor layer and low-quality single-crystal or polycrystalline silicon for the support.

It is to be understood that the invention is not to be limited to the exact configuration as illustrated and described herein. Accordingly, all expedient modifications readily attainable by one of ordinary skill in the art from the disclosure set forth herein, or by routine experimentation there from, are deemed to be within the spirit and scope of the invention as defined by the appended claims.

What is claimed is:

1. A process for repeated treatment of wafers, comprising preparing a reusable donor wafer for donating a thin layer of a semiconductor material by assembling a donor layer of semiconductor material having a thickness of plural thin layers onto a support layer of a semiconductor material, wherein the semiconductor material of the support layer is of a lower quality or is less precious than the semiconductor material of the thin layer or layers of the donor wafer.

2. The process of claim 1 wherein the semiconductor material of the support layer is a non-monocrystalline or polycrystalline material.

3. The process of claim 1 wherein the semiconductor material of the thin layer or layers is a monocrystalline material.

4. The process of claim 1 wherein the semiconductor material of the support layer and of the thin layer or layers are each a monocrystalline material.

5. The process of claim 4 wherein the semiconductor material of the support layer and of the thin layer or layers is less precious due to differences in price, availability, or usability.

6. The process of claim 4 wherein the semiconductor material of the support layer is monocrystalline silicon while the semiconductor material of the thin layer or layers is monocrystalline silicon carbide.

7. The process of claim 1 wherein the semiconductor material of the support layer is polycrystalline silicon carbide and the semiconductor material of the thin layer or layers is gallium nitride.

8. The process of claim 1 further comprising creating a weakness at a selected depth in the donor layer for separating the thin layer.

9. The process of claim 8 further comprising forming an electronic, optoelectronic, or optical device in the thin layer after separation.

10. The process of claim 8 wherein the weakness is created by implanting gaseous species to weaken the donor layer at a selected depth.

11. The process of claim 10 further comprising bonding the donor layer to a receiving wafer for donating the thin layer to the receiving wafer.

12. The process of claim 1 wherein the preparing step comprises wafer bonding polished faces of the donor layer and the support layer.

13. The process of claim 1 wherein the preparing comprises preparing a bulk layer from silicon, gallium nitride, silicon carbide, aluminum nitride, or sapphire as the support layer, and wherein the donor layer is a bulk slice.

14. An electronic, optoelectronic, or optical component comprising a donor layer of semiconductor material having a thickness of plural thin layers onto a support layer of a semiconductor material, wherein the semiconductor material of the support layer is of a lower quality or is less precious than the semiconductor material of the thin layer or layers of the donor wafer.

15. The component of claim 14 wherein the semiconductor material of the support layer is a non-monocrystalline or polycrystalline material.

16. The component of claim 14 wherein the semiconductor material of the thin layer or layers is a monocrystalline material.

17. The component of claim 14 wherein the semiconductor material of the support layer and of the thin layer or layers are each a monocrystalline material.

18. The component of claim 14 wherein the semiconductor material of the support layer and of the thin layer or layers is less precious due to differences in price, availability, or usability.

19. The component of claim 14 wherein the semiconductor material of the support layer is monocrystalline silicon while the semiconductor material of the thin layer or layers is monocrystalline silicon carbide.

20. The component of claim 14 wherein the semiconductor material of the support layer is polycrystalline silicon carbide and the semiconductor material of the thin layer or layers is gallium nitride.

21. A process for repeated treatment of wafers to transfer plural thin layers therefrom, comprising preparing a reusable donor wafer for donating a thin layer of semiconductor material by assembling a donor layer of a semiconductor material having a thickness of plural thin layers onto a support layer of a semiconductor material, and sequentially transferring plural thin layers from the donor layer to receiving wafers by separation of each thin layer along a region of weakness in the donor layer prior to transfer of a thin layer to a receiving wafer, wherein the semiconductor material of the support layer is of a lower quality or is less precious than the semiconductor material of the thin layer or layers of the donor wafer.

* * * * *